(12) United States Patent
Taniguchi et al.

(10) Patent No.: US 8,684,647 B2
(45) Date of Patent: Apr. 1, 2014

(54) OPERATING MEMBER MOUNTING STRUCTURE

(75) Inventors: Yuki Taniguchi, Kyoto (JP); Kumpei Fujita, Kyoto (JP); Kenichi Ikeda, Kyoto (JP)

(73) Assignee: Nintendo Co., Ltd., Kyoto (JP)

( * ) Notice: Subject to any disclaimer, the term of this patent is extended or adjusted under 35 U.S.C. 154(b) by 69 days.

(21) Appl. No.: 13/158,986

(22) Filed: Jun. 13, 2011

(65) Prior Publication Data

US 2011/0304246 A1 Dec. 15, 2011

(30) Foreign Application Priority Data

Jun. 11, 2010 (JP) ................................. 2010-134196

(51) Int. Cl.
*H01H 21/22* (2006.01)

(52) U.S. Cl.
USPC .......................... 411/508; 345/161; 200/345

(58) Field of Classification Search
USPC .......... 411/508, 509, 913; 345/184, 160, 161; 24/297; 200/345
See application file for complete search history.

(56) References Cited

U.S. PATENT DOCUMENTS

| | | | | |
|---|---|---|---|---|
| 3,225,641 | A * | 12/1965 | Harris et al. .................. | 411/510 |
| 3,309,955 | A * | 3/1967 | Turnbull et al. .............. | 411/509 |
| 4,393,551 | A * | 7/1983 | Wollar et al. .................. | 24/627 |
| 4,403,377 | A * | 9/1983 | Mizusawa ...................... | 24/681 |
| 4,810,147 | A * | 3/1989 | Hirohata ........................ | 411/349 |
| 5,332,347 | A * | 7/1994 | Kimisawa ...................... | 411/182 |
| 6,528,740 | B2 * | 3/2003 | Miyoshi ......................... | 200/5 R |
| 6,667,733 | B2 * | 12/2003 | Miyoshi ......................... | 345/156 |
| 6,797,896 | B2 * | 9/2004 | Lee ................................ | 200/6 A |
| 7,310,083 | B2 * | 12/2007 | Hagiwara et al. ............. | 345/156 |
| 7,777,721 | B2 * | 8/2010 | Kosu .............................. | 345/157 |

FOREIGN PATENT DOCUMENTS

| | | |
|---|---|---|
| JP | 08-077881 | 3/1996 |
| JP | 08-077882 | 3/1996 |
| JP | 10-255595 | 9/1998 |
| JP | 11-045628 | 2/1999 |
| JP | 2000-276294 | 10/2000 |
| JP | 2006-146973 | 6/2006 |

\* cited by examiner

*Primary Examiner* — Flemming Saether
(74) *Attorney, Agent, or Firm* — Nixon & Vanderhye P.C.

(57) ABSTRACT

An operating member mounting structure includes a mounting plate having an inner edge defining a mounting hole, and an operating member includes a keytop and a flange which are coupled to each other by a shaft, and the flange is formed with a slit. The diameter of the flange is larger than that of the mounting hole. When the operating member is rotated and pressed down in a state that the slit receives the inner edge of the mounting hole, the flange passes over the inner edge of the mounting hole to be fully brought beneath the mounting plate. An operating shaft of an operated device is inserted into an insertion hole opened on the surface of the flange. By operating the keytop exposed from the top surface of the mounting plate, the operated device can be operated through the operating shaft.

18 Claims, 5 Drawing Sheets

(A)

(B)

OPERATING MEMBER MOUNTING STRUCTURE

CROSS REFERENCE OF RELATED APPLICATION

The disclosure of Japanese Patent Application No. 2010-134196 filed on Jun. 11, 2010 is incorporated herein by reference.

BACKGROUND OF THE INVENTION

1. Field of the Invention

The present invention relates to an operating member mounting structure. More specifically, the present invention relates to an operating member mounting structure which mounts an operating member into a mounting hole formed on a mounting plate.

2. Description of the Related Art

In a patent document 1, a coordinate input device which can be used in a personal computer, a cellular phone, a game apparatus, or the like is disclosed. In the coordinate input device, when a sliding operation is performed by an operating member provided on a cover, a movable member which is coupled to the operating member to be situated beneath the cover moves, and resistances in X and Y directions change in accordance with the movement to thereby allow detections of a sliding direction and a sliding amount (coordinate position) of the movable member.

[Patent document 1] Japanese Patent Application Laying-Open No. 2006-146973 [G06F 3/033]

In the related art of the patent document 1, a holding portion of the movable member is merely inserted into the bottom surface of the operating member, and therefore, the operating member may be disengaged from the holding portion.

SUMMARY OF THE INVENTION

Therefore, it is a primary object of the present invention to provide a novel operating member mounting structure.

Another object of the present invention is to provide an operating member mounting structure which is hard to slip off.

A first aspect is an operating member mounting structure which mounts an operating member on a mounting plate having an inner edge defining a mounting hole, the operating member includes a flange and a keytop each being larger than the mounting hole, the flange and the keytop being coupled to each other by a shaft and the flange being formed with a slit, the slit is provided to have an opening at a part of a peripheral edge of the flange to thereby receive the mounting plate around the mounting hole within the slit, and is formed to have a depth such that when the operating member is rotated in a state that an inner edge of the slit and the inner edge of the mounting hole are brought into engagement with each other while the mounting plate around the mounting hole is received within the slit, a point furthest from the engagement point of the peripheral edge of the flange can pass through the mounting hole, and the shaft passes through the mounting hole with the keytop exposed from a top surface of the mounting plate in a state that the flange is brought beneath the mounting plate through the mounting hole.

When the mounting structure according to the first aspect is assembled, the inner edge of the mounting plate is received by the slit. When the inner edge is pressed on the side of a base end of the slit, a part of the peripheral edge of the flange is brought beneath the mounting plate. When the keytop, that is, the operating member is rotated and pressed down into the mounting hole in this state, the flange is elastically deformed and rotated, and the peripheral edge of the flange sequentially passes over the inner edge to finally bring the entire flange beneath the mounting plate.

According to the first aspect, the flange larger than the mounting hole is situated beneath the mounting plate, and therefore, even if an upward force is applied to the operating member, the flange is restricted by the mounting plate, so that the operating member is never easily slipped off At the same time, the keytop larger than the mounting hole is provided, and therefore, more comfortable operability in a key operation can be implemented, and an area of the mounting hole which is exposed to the user can be reduced.

A second aspect is according to the first aspect, and is an operating member mounting structure, wherein the depth of the slit is set to a depth such that the peripheral edge of the flange passes through the mounting hole when at least the flange is elastically deformed.

In the second aspect, by using an elastic deformation of at least the flange, the flange can be pressed beneath the mounting plate.

A third aspect is according to the first or the second aspect, and is an operating member mounting structure further comprising an operated device which is to be connected to the operating member.

In the third aspect, by operating the keytop of the operating member, the operated device can be operated.

A fourth aspect is an operating member mounting structure, comprising: a mounting plate which has an inner edge defining a mounting hole; a shaft which is to be inserted through the mounting hole; a keytop which is larger than the mounting hole and fixed at an upper end of the shaft, and is to be provided on a top surface of the mounting plate; a flange which is larger than the mounting hole and fixed at a lower end of the shaft, and is to be provided beneath the mounting plate; and a slit which is formed on the flange and can receive the inner edge.

According to the fourth aspect, the flange larger than the mounting hole is situated beneath the mounting plate, and therefore, even if an upward force is applied to the operating member, the operating member is never slipped off the mounting hole.

A fifth aspect is according to the fourth aspect, and is an operating member mounting structure further comprising an operated device which is provided beneath the mounting plate and has an operating shaft to be coupled to the flange.

In the fifth aspect, by operating the keytop, the operated device can be operated via the operating shaft.

A sixth aspect is an operating member mounting structure comprising: a mounting plate which has a inner edge defining a circular mounting hole, an operated device which is provided beneath the mounting plate and has an operating shaft extending upward, a flange which has a diameter larger than that of the mounting hole, is formed with a slit radially extending from a peripheral edge to have a width larger than a thickness of the inner edge, and is brought beneath the mounting plate by making the slit receive the inner edge, a shaft which extends upward from a center of the flange and is inserted through the mounting hole, an insertion hole which is formed on the shaft and is opened on a surface of the flange to be inserted by the operating shaft, and a keytop which is provided above the mounting plate and is coupled to the shaft.

In the sixth aspect, by operating the keytop, the operated device can be operated. Moreover, the flange larger in diameter than the mounting hole is situated beneath the mounting plate, and thus, even if an upward force is applied to the flange through the shaft, the flange is never slipped off the mounting hole.

A seventh aspect is an electronic appliance having an operating member mounting structure according to any one of the first to sixth aspects, wherein the mounting plate is a part of a housing.

According to the aspects of this invention, the flange larger than the mounting hole is situated beneath the mounting plate through the mounting hole, and the operating member is coupled to the flange by the shaft, and therefore, even if an upward force is applied to the operating member, the flange is restricted by the mounting plate, so that the operating member is never easily slipped off.

The above described objects and other objects, features, aspects and advantages of the present invention will become more apparent from the following detailed description of the present invention when taken in conjunction with the accompanying drawings.

BRIEF DESCRIPTION OF THE DRAWINGS

FIG. 3(A) is a plan view, FIG. 3(B) is a bottom view, and FIG. 3(C) is a cross-sectional view taken along line C-C in FIG. 3(A).

FIG. 4(A) shows an initial state in which an inner edge of the mounting plate is received by a slit of a flange, and FIG. 4(B) shows a state in which the operating member is completely mounted such that the flange is brought beneath the mounting plate by rotation from the state in FIG. 4(A).

DETAILED DESCRIPTION OF THE PREFERRED EMBODIMENTS

Figure 1:
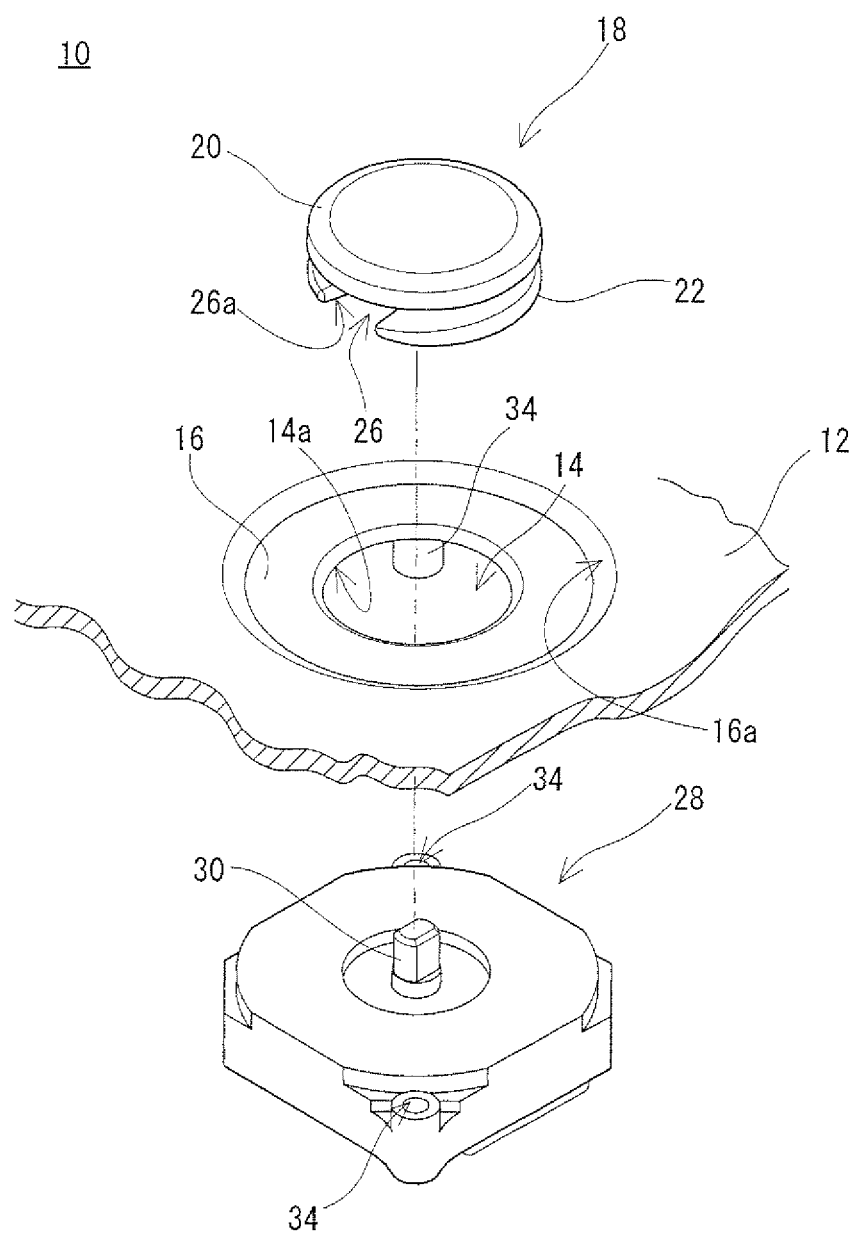
FIG. 1 is an exploded perspective view showing an operating member mounting structure according to one embodiment of the present invention as seen from a top side.
Figure 2:
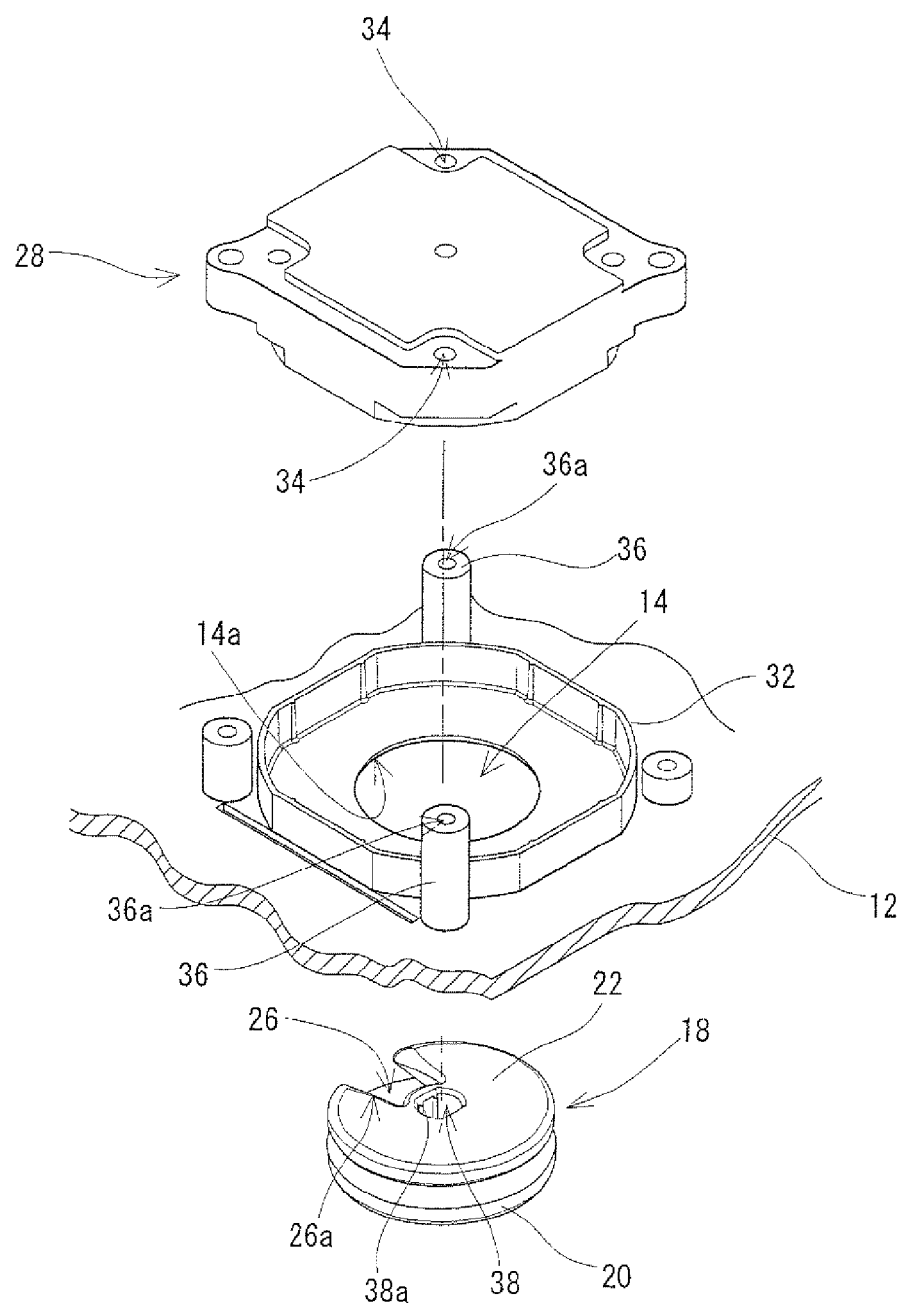
FIG. 2 is an exploded perspective view showing the mounting structure of the embodiment as seen from a bottom side.

Referring to FIG. 1 and FIG. 2, an operating member mounting structure (hereinafter, sometimes referred to as "structure") 10 of one embodiment according to the present invention is described. The operating member mounting structure 10 includes a mounting plate 12 which is injection-molded of plastic like polycarbonate, for example, and the mounting plate 12 is formed with a mounting hole 14. That is, the mounting plate 12 has an inner edge 14a defining the mounting hole 14. If the structure 10 is concerned to an electronic appliance (not illustrated), the mounting plate 12 may be a part of a housing of the electronic appliance.

On the top surface of the mounting plate 12, a spot facing portion 16 whose size is defined by an inner wall 16a is formed around the mounting hole 14, and at the spot facing portion 16, the mounting plate 12 is made thinner than the other portions.

The structure 10 of this embodiment is a structure of mounting the operating member 18 on the mounting plate 12 by using the mounting hole 14, and the operating member 18 is injection-molded of plastic like polycarbonate, for example, and includes a keytop 20 which is exposed from the mounting plate 12, and a flange 22 which is coupled to the keytop 20 by a shaft 24 (FIG. 3) and functions as a retainer of the operating member 18. That is, the keytop 20, the shaft 24, and the flange 22 are integrally molded as a single piece. The flange 22 is to be pressed beneath the mounting plate 12 through the mounting hole 14, and thus the flange 22 has a slit 26 which radially extends. That is, the flange 22 has an inner edge 26a defining the slit 26.

The operating member 18 is to be operated for operating an operated device 28 by a user, and the operated device 28 is placed beneath the mounting plate 12, and is coupled to the operating member 18 by an operating shaft 30. Accordingly, when the user puts a finger on the keytop 20 to move it in a horizontal plane, the operating shaft 30 of the operated device 28 moves in accordance with the movement.

For example, assuming that the operated device 28 is a coordinate input device used in the aforementioned related art, by operating the operating member 18 in this embodiment, a movement position and a moving amount, that is, a coordinate position of the operating member 18 can be detected. It should be noted that the operated device 28 is not restricted to such a coordinate input device, and may be devices of arbitrary kinds capable of applying an input value, input information or input data to processing devices, such as a computer (not illustrated), etc. by moving the operating member 18.

The operated device 28 has an approximately rectangular parallelepiped configuration with a certain thickness in this embodiment. On the bottom surface of the mounting plate 12, a rib 32 is formed so as to surround the mounting hole 14 and accommodate the operated device 28. The rib 32 allows the operated device 28 to be positioned inside it.

A pair of screw holes 34 are formed to be diagonally opposite to each other so as to penetrate from the top surface of the operated device 28 to the bottom surface of thereof. At positions corresponding to the pair of screw holes 34 and outside the rib 32 on the bottom surface (back surface) of the mounting plate 12, a pair of mounting legs 36 are formed, and each of the mounting legs 36 is formed with a screw hole 36a of a predetermined depth. Here, in this embodiment, the above-described screw hole 34 is a through-hole, and the screw hole 36a is not threaded in advance, but by attaching the self-tapping screw to the screw hole 36a via the screw hole 34, the operated device 28 is fixed to the mounting plate 12.

The operating member 18 is formed with an insertion hole 38 which opens on the surface (back surface) of the flange 22 as shown in FIG. 2. The insertion hole 38 is formed on the shaft 24 (FIG. 3), and has a necessary number of spacers 38a (two spacers on each opposing surface in this embodiment) extending axially. The insertion hole 38 is one into which the operating shaft 30 of the operated device 28 is to be inserted, and when the operated device 28 is positioned within the rib 32 and fixedly mounted on the bottom surface of the mounting plate 14 by utilizing the screw holes 34 and 36a, the operating shaft 30 is inserted into the insertion hole 38. Here, the spacers 38a are formed, so that the operating shaft 30 is inserted into the insertion hole 38 in a "tightly fit" (shrink fit) situation.

Figure 3:
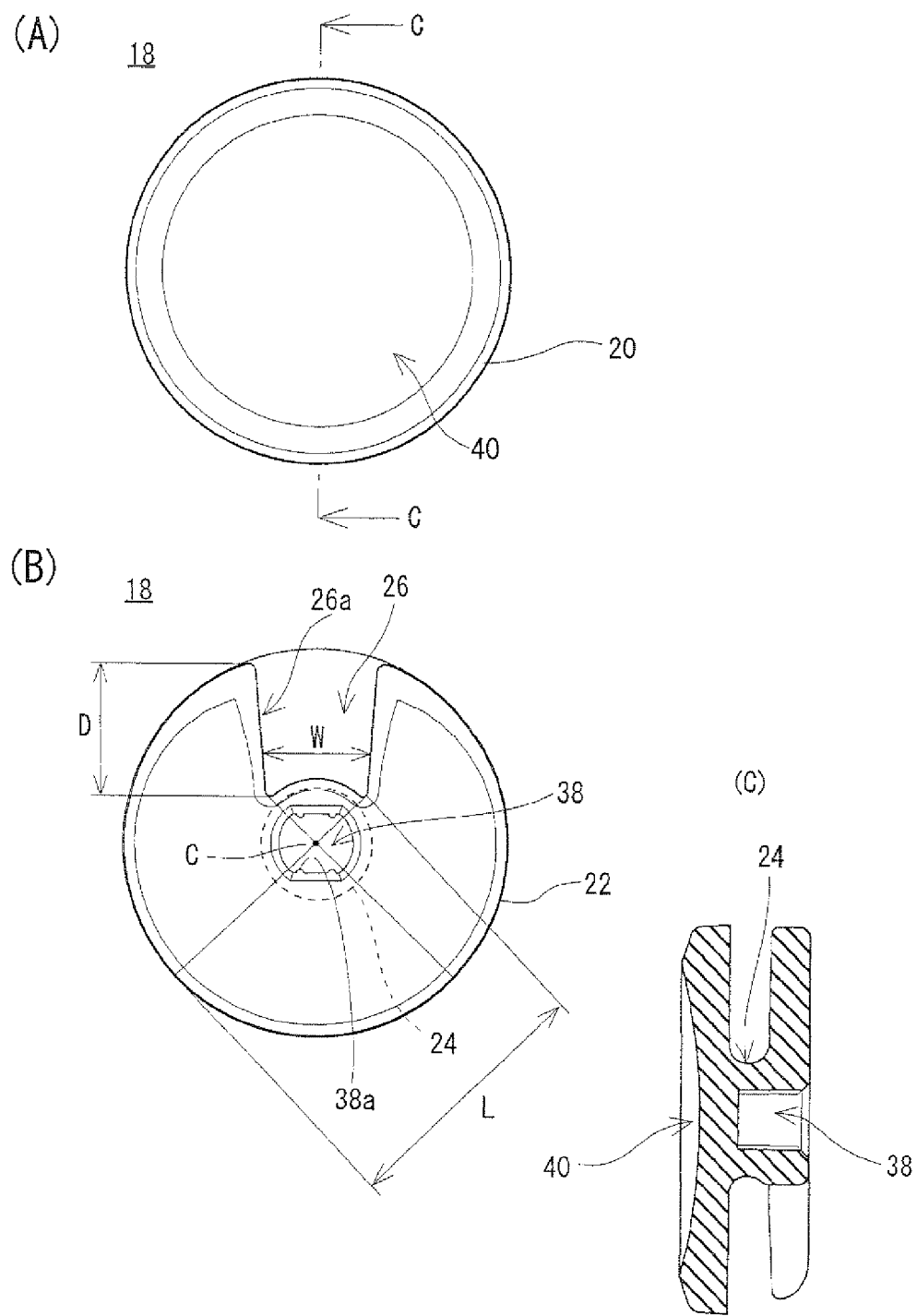
FIG. 3 is an illustrative view showing in detail an operating member of the embodiment.

The operating member 18 is shown in further detail in FIG. 3. FIG. 3(A) is a plan view as seen from the side of the keytop 20, FIG. 3(B) is a bottom view as seen from the side of the flange 22, and FIG. 3(C) is a cross-sectional view taken along line C-C in FIG. 3(A).

As well understood from FIG. 3(C), on the top surface of the keytop 20, a recess 40 is formed. Accordingly, the user places the finger into this recess 40 to thereby perform a moving operation on the keytop 20, that is, the operating member 18. The shaft 24 coupling the keytop 20 and the flange 22 to each other is clearly shown in FIG. 3(C), and it is found that the shaft 24 is formed with the insertion hole 38 and opened on the surface of the flange 22.

The diameter of the keytop 20 and the diameter of the flange 22 each is set so as to be larger than that of the mounting hole 14 of the mounting plate 12. The keytop 20 is exposed from the mounting plate 12, and thus, making the diameter of the keytop 20 larger than that of the mounting hole 14 is immaterial. In this embodiment, the diameter of the mounting hole 14 is 10.9 mm, and the diameter of the keytop 20 is 14.5 mm.

However, the flange 22 is arranged beneath the mounting plate 12, and thus, when the diameter thereof is larger than the diameter of the mounting hole 14, the flange 22 does not pass through the mounting hole 14 to prevent the mounting plate 12 from being brought beneath it. Thus, it is conceivable that the diameter of the flange 22 is made smaller than that of the mounting hole 14. However, if the diameter of the flange 22 is made smaller than that of the mounting hole 14, the flange 22 is disadvantageously easily slipped off the mounting hole 14 to disengage the operating member 18 from the mounting plate 12.

Accordingly, as well as the diameter of the flange 22 is made larger than the diameter of the mounting hole 14, a further contrivance to bring the flange 22 beneath the mounting plate 12 is required. In this embodiment, the diameter of the mounting hole 14 is 10.9 mm as described, and the diameter of the flange 22 is 14.4 mm. In this embodiment, as a contrivance, the flange 22 is formed with the slit 26. The slit 26 is formed such that the base portion is curved along the perimeter of the shaft 24 in this embodiment. The width W (3.8 mm at the base end and 4.6 mm at the leading end in this embodiment) of the slit 26 is made larger than the thickness of the mounting plate 12 at the spot facing portion 16 (FIG. 1) (0.6 mm in this embodiment) so as to receive the inner edge 14a defining the mounting hole 14. The depth D of the slit 26 at both ends of the width W is set such that when the inner edge 14 of the mounting plate 12 is received, as to the line segment extending from a point on the periphery in the circumferential direction of the inner edge 26a defining the slit 26 to the peripheral edge of the flange 22 through the center C of the flange 22, the L (FIG. 3(B)) when the line segment becomes the longest is a size capable of passing through the mounting hole 14 of the mounting plate 12. For example, by setting the length L to be smaller than the diameter of the mounting hole 14, the depth D may be set to a size capable of passing through the mounting hole 14. However, in view of the elasticity of the material being made of at least the flange, the depth may be set to a size capable of passing through the mounting hole 14. That is, the depth may be set to a depth capable of passing over the inner edge 14a of the mounting hole 14 by the elastic deformation of the flange 22. At this time, the elasticity of the material forming of the mounting plate 12 can also be considered. In this case, the depth may be set to a size capable of passing over the inner edge 14a of the mounting hole 14 through the elastic deformation by the flange 22 and the inner edge 14a of the mounting hole 14.

In other words, the slit 26 is provided to have an opening at a part of the peripheral edge of the flange 22, the width W of the slit 26 is larger than the thickness of the inner edge 14a of the mounting plate, and the depth of the slit 26 is set to a depth such that in a state that the inner edge 14a of the mounting plate 12 is received by the slit, the distance between a point at which the side edge 26a of the slit and the inner edge 14a of the mounting plate are brought into engagement with each other and a point on the peripheral edge of the flange 22 which is furthest from the engaged point is a size capable of passing through the mounting hole 14.

As well understood from FIG. 3(B), the slit 26 is formed to be gradually widened in the radially outward direction of the flange 22. That is, the inner edge 26a defining the slit 26 flares outwardly from the base portion to the leading portion. The reason why the operating member 18 is injection-molded of plastic is for easy drawing from a mold, and for easy insertion when the inner edge 14a of the mounting plate 12 is inserted into the slit 26 as described later.

Figure 4:
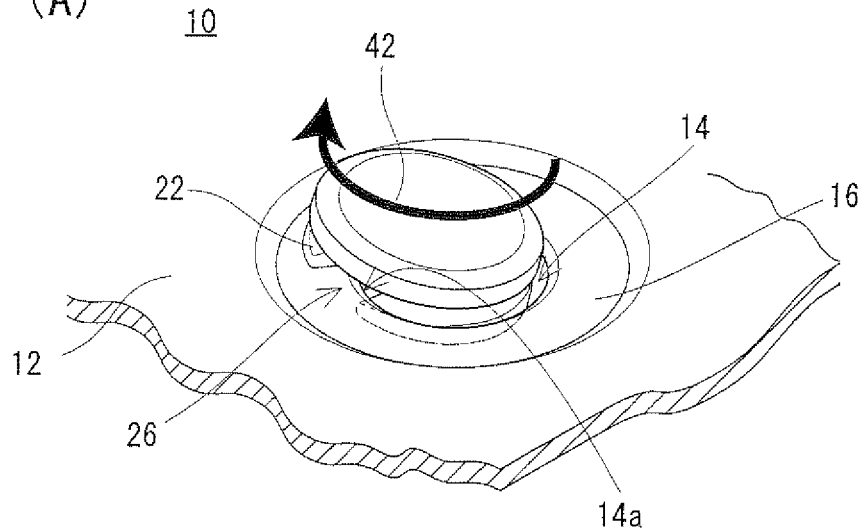
FIG. 4 is an illustrative view showing a process of mounting the operating member on a mounting plate through a mounting hole in this embodiment.
Figure 4:
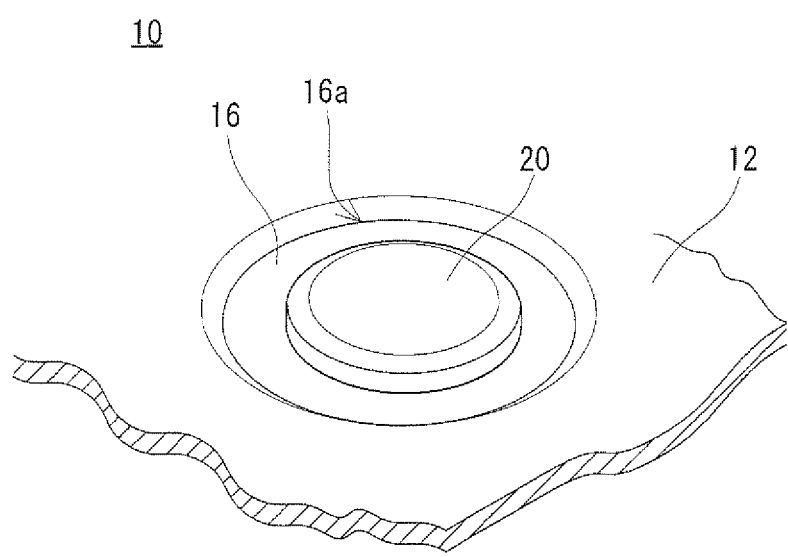

When such an operating member 18 is mounted on the mounting plate 12 to assemble the structure 10, the inner edge 14a of the mounting plate 12 is first brought into the slit 26 as shown in FIG. 4(A). That is, the inner edge 14a of the mounting hole 14 is received within the slit 26. In this state, the operating member 18 is tilted to be pressed into the mounting hole 14. Here, since the keytop 20 is coupled to the flange 22 by the shaft 24 to be situated above it, the tilt amount of the operating member 18 is restricted by a contact between the keytop 20 and the top surface of the spot facing portion 16. The depth D of the slit 26 is designed as described above, and therefore, while the inner edge 14a of the mounting hole 14 is inserted into the slit 26 as shown in FIG. 4(A), a part of the peripheral edge of the flange 22 is brought beneath the mounting plate 12 over the inner edge 14a at this position.

Thereafter, as shown in an arrow 42 in FIG. 4(A), the keytop 20, that is, the operating member 18 is rotated. That is, the operating member 18 is rotated relative to the mounting plate 12 in the direction of the arrow 42. When the operating member 18 is rotated and pressed down, the peripheral edge of the flange 22 sequentially passes over the inner edge 14a of the mounting hole 14 beneath the mounting plate 12, and then, the flange 22 is entirely brought beneath the mounting plate 12. This situation is shown in FIG. 4(B). At this time, the operating member 18 is made of the plastic, and therefore, each of the keytop 20, the flange 22 and the shaft 24 has an elasticity, and the flange 22 may be formed so as to be fully brought beneath the mounting plate 12 while being elastically deformed. In this case, in designing the depth D of the slit 26 as described above, the depth D can be set to a size in view of the elasticity, making design flexibility great.

The slit 26 is thus formed on the flange 22, and the operating member 18 itself is rotated and pressed down from the side of the keytop 20 in a state that the inner edge 14a of the mounting hole 14 is inserted into slit 26, and whereby, the flange 22 larger than the mounting hole 14 can be pressed beneath the mounting plate 12 through the mounting hole 14. That is, by causing the slit 26 to receive the inner edge 14a of the mounting hole 14, the flange 22 can be pressed beneath the mounting plate 12 through the mounting hole 14.

Then, as especially well understood from FIG. 1 and FIG. 2, the operating shaft 30 of the operated device 28 is pressed into the insertion hole 38 opened on the bottom surface of the operating member 18, and the self-tapping screws are screwed into the screw holes 34 and 36a, and whereby, the operated device 28 is fixedly mounted on the rib 32.

Figure 5:
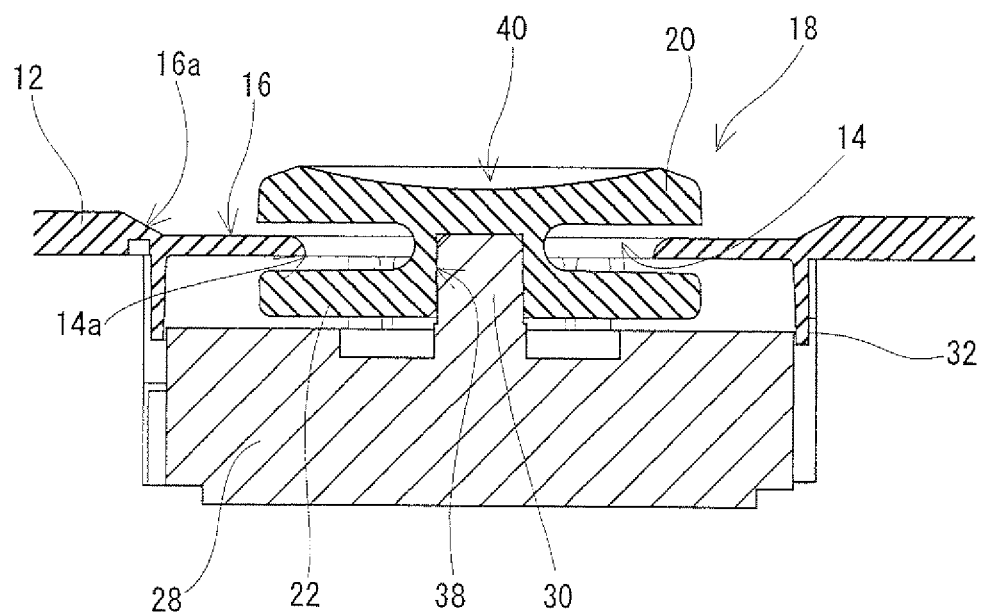
FIG. 5 is a cross-sectional illustrative view showing a final state of the embodiment.

The completed final situation is shown in FIG. 5 as a cross-sectional view. As shown in FIG. 5, the flange 22 of the operating member 18 is pressed beneath the mounting plate 12 while the keytop 20 is exposed from the top surface of the mounting plate 12. At this time, the spot facing portion 16 is formed around the mounting hole 14, and thus, the protruded amount of the keytop 20 is small by the thinness at the spot facing portion 16. Thus, an unintended operation of the operating member 18, that is, the operated device 28 due to a careless touch of the keytop 20 with the finger rarely occurs. Furthermore, in a case that the structure 10 is formed on one inward surface of one housing of a folding electronic apparatus, when the apparatus is folded, the protruding portion of the keytop and the housing being opposed to the housing with the surface on which the keytop is formed hardly interact with each other, making the design flexibility great. Here, the spot facing portion 16 is not indispensable. In this case, the keytop 20 is fully protruded from the top surface of the mounting plate 14.

In this embodiment, as shown in FIG. 5, since the bottom surface of the keytop 20 is in contact with the top surface of the spot facing portion 16, so that when the keytop 20 is operated with the finger tip (not illustrated) put into the recess 40, the keytop 20 can be securely operated without any rattling.

The movable range of the keytop 20 is basically coincident with the movable range of the operating shaft 30 of the operated device 28, but for preventing the keytop 20 from moving over the movable range of the operating shaft 30 of the operated device 28, the inner wall 16a of the spot facing portion 16 is in contact with the lower peripheral edge of the keytop 20 to thereby restrict the movement of the keytop 20. By operating the keytop 20, the operating shaft 30 can be moved in an arbitrary direction by an arbitrary amount within the moving range of the operating shaft 30 of the operated device 28. If the operated device 28 is a coordinate input device like the related art, in a case that the keytop 20 is slid, the sliding direction and the sliding amount can be detected. Then, on the basis of the detection result, for example, a moving operation can be performed on a character, etc. displayed on the display in response to the sliding.

Furthermore, since the flange 22 is completely beneath the mounting plate 12 and is larger in diameter than the mounting hole 14, even if an upward pulling force is applied to the operating member 18, the keytop 20, that is, the operating member 18 is never slipped off the mounting hole 14.

In addition, the space between the bottom surface of the flange 22 and the top surface of the operated device 28 is made small, and an area of the bottom surface of the flange 22 is also relatively wide, and therefore, even if there is a little rattling between the operating shaft 30 and the insertion hole 38, the bottom surface of the flange 22 is in contact with the top surface of the operated device 28 to thereby reduce the rattling.

Here, in the above-described embodiment, the planar shape of each of the keytop and the flange is a circle, but it may be different shapes, such as an oval, a rectangle, etc.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An operating member mounting structure which mounts an operating member on a mounting plate having an inner edge defining a mounting hole, wherein
    said operating member includes a flange with a substantially constant radius and a keytop, each being larger than said mounting hole, said flange and said keytop being coupled to each other by a shaft and said flange being formed with a slit,
    said slit is provided to have an opening at a part of a peripheral edge of said flange to thereby receive the mounting plate around said mounting hole within said slit, and is formed to have a depth such that when said operating member is rotated in a state that an inner edge of said slit and the inner edge of said mounting hole are brought into engagement with each other while the mounting plate around said mounting hole is received within said slit, a point furthest from the engagement point of the peripheral edge of said flange can pass through said mounting hole,
    said shaft passes through said mounting hole with said keytop exposed from a top surface of said mounting plate in a state that said flange is brought beneath said mounting plate through said mounting hole; and
    wherein an operated device provided beneath said mounting plate has an operating shaft that is coupled to said flange, the operating shaft having a longitudinal axis that extends substantially perpendicular to a plane of the mounting plate, wherein the operating shaft is movable to cause the operated device to output a signal.

2. An operating member mounting structure according to claim 1, wherein the depth of said slit is set to a depth such that the peripheral edge of said flange passes through said mounting hole when at least said flange is elastically deformed.

3. An electronic appliance having an operating member mounting structure recited in claim 1, wherein said mounting plate is a part of a housing.

4. An operating member mounting structure according to claim 1, wherein a width of the slit at a periphery of the flange is greater than a width of the slit at an opposite inner end of the slit.

5. An operating member mounting structure according to claim 1, wherein a portion of an upper surface of the mounting plate that surrounds the circular mounting hole is recessed, and wherein the keytop is received in the recessed portion of the upper surface of the mounting plate such that a lower surface of the keytop is located below non-recessed portions of the upper surface of the mounting plate.

6. An operating member mounting structure, comprising:
    a mounting plate which has an inner edge defining a mounting hole, wherein an upper surface of the mounting plate surrounding the mounting hole is recessed;
    a shaft which is to be inserted through said mounting hole;
    a keytop which is larger than said mounting hole and fixed at an upper end of said shaft, the keytop being received in the recessed portion of the upper surface of said mounting plate;
    a flange which is larger than said mounting hole and fixed at a lower end of said shaft, and is to be provided beneath said mounting plate;
    a slit which is formed on said flange and can receive said inner edge; and
    an operated device which is provided beneath said mounting plate, the operated device having an operating shaft that is coupled to said flange, the operating shaft having a longitudinal axis that extends substantially perpendicular to a plane of the mounting plate, wherein the operating shaft is movable to cause the operated device to output a signal.

7. An electronic appliance having an operating member mounting structure recited in claim 6, wherein said mounting plate is a part of a housing.

8. An operating member mounting structure according to claim 6, wherein a lower surface of the keytop is located below non-recessed portions of the upper surface of the mounting plate.

9. An operating member mounting structure according to claim 6, wherein the operating shaft is movable in a direction that is substantially perpendicular to the longitudinal axis of the operating shaft.

10. An operating member mounting structure, comprising:
    a mounting plate which has a inner edge defining a circular mounting hole;

an operated device which is provided beneath said mounting plate and has an operating shaft extending upward, the operating shaft being movable to cause the operated device to output a signal;

a flange which has a diameter larger than that of said mounting hole, is formed with a slit radially extending from a peripheral edge to have a width larger than a thickness of said inner edge, and is brought beneath said mounting plate by making said slit receive said inner edge;

a shaft which extends upward from a center of said flange and is inserted through said mounting hole;

an insertion hole which is formed on said shaft and is opened on a surface of said flange so as to receive said operating shaft; and a keytop which is provided above said mounting plate and is coupled to said shaft.

11. An electronic appliance having an operating member mounting structure recited in claim 10, wherein said mounting plate is a part of a housing.

12. An operating member mounting structure according to claim 10, wherein a surface of the keytop located opposite the flange comprises a substantially flat surface.

13. An operating member mounting structure according to claim 10, wherein a surface of the keytop located opposite the flange comprises a substantially concave surface.

14. An operating member mounting structure according to claim 10, wherein the operating shaft has a longitudinal axis that extends substantially perpendicular to a plane of the mounting plate, and wherein the shaft is movable in a direction that is perpendicular to the longitudinal axis.

15. An operating member mounting structure according to claim 14, wherein the operating shaft is movable in at least two non-parallel directions that are both substantially perpendicular to the longitudinal axis.

16. An operating member mounting structure according to claim 10, wherein the flange has a substantially constant radius.

17. An operating member mounting structure according to claim 10, wherein a portion of an upper surface of the mounting plate that surrounds the circular mounting hole is recessed.

18. An operating member mounting structure according to claim 17, wherein the keytop is received in the recessed portion of the upper surface of the mounting plate such that a lower surface of the keytop is located below non-recessed portions of the upper surface of the mounting plate.

* * * * *